(12) United States Patent
Kubby

(10) Patent No.: US 6,828,171 B2
(45) Date of Patent: Dec. 7, 2004

(54) SYSTEMS AND METHODS FOR THERMAL ISOLATION OF A SILICON STRUCTURE

(75) Inventor: Joel A. Kubby, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/683,533

(22) Filed: Jan. 16, 2002

(65) Prior Publication Data

US 2003/0134445 A1 Jul. 17, 2003

(51) Int. Cl.[7] .............................................. H01L 21/00
(52) U.S. Cl. .......................................... 438/31; 385/16
(58) Field of Search .......................... 438/31, 53, 54, 438/57, 405, 411, 412; 385/16

(56) References Cited

U.S. PATENT DOCUMENTS

| | | | | |
|---|---|---|---|---|
| 5,510,276 A | * | 4/1996 | Diem et al. ................. | 438/53 |
| 5,583,373 A | * | 12/1996 | Ball et al. .................. | 257/678 |
| 5,587,343 A | * | 12/1996 | Kano et al. ................. | 438/52 |
| 5,883,009 A | * | 3/1999 | Villa et al. ................. | 438/739 |
| 6,023,121 A | * | 2/2000 | Dhuler et al. ............... | 310/307 |
| 6,121,552 A | * | 9/2000 | Brosnihan et al. .......... | 174/253 |
| 6,310,419 B1 | * | 10/2001 | Wood ....................... | 310/306 |
| 6,329,655 B1 | * | 12/2001 | Jack et al. ................. | 250/338.1 |
| 6,356,689 B1 | * | 3/2002 | Greywall ................... | 385/52 |
| 6,407,851 B1 | * | 6/2002 | Islam et al. ................ | 359/291 |
| 6,472,244 B1 | * | 10/2002 | Ferrari et al. ............... | 438/53 |

FOREIGN PATENT DOCUMENTS

| | | |
|---|---|---|
| GB | 2 320 104 A | 6/1998 |
| WO | WO 99/21036 | 4/1999 |

* cited by examiner

*Primary Examiner*—W. David Coleman
(74) *Attorney, Agent, or Firm*—Oliff & Berridge, PLC

(57) ABSTRACT

A silicon structure is at least partially thermally isolated from a substrate by a gap formed in an insulation layer disposed between the substrate and a silicon layer in which the silicon structure is formed. In embodiments, the substrate is made of silicon and the silicon layer is made of single crystal silicon. In embodiments, the gap is formed such that a surface of the substrate under the gap is maintained substantially unetched. In other embodiments, the gap is formed without affecting the surface of the substrate underlying the gap. In particular, the gap may be formed by removing a portion of the insulation layer with an etch that does not affect the surface of the substrate underlying the gap. In embodiments the etch is highly selective between the material of the insulation layer and the material of the substrate. The etch selectivity may be about 20:1 or greater.

19 Claims, 13 Drawing Sheets

Related Art

SYSTEMS AND METHODS FOR THERMAL ISOLATION OF A SILICON STRUCTURE

BACKGROUND OF THE INVENTION

1. Field of Invention

This invention relates to systems and methods for thermal isolation of a silicon structure. In particular, the systems and methods of this invention relate to micromachined or microelectromechanical system based devices and the fabrication thereof.

2. Description of Related Art

It is know to thermally isolate a silicon structure from a substrate that supports the silicon structure. For example, an integrated optical circuit, as shown in FIG. 1, is described in international patent document WO 99/21036, published Apr. 29, 1999, which is incorporated herein by reference in its entirety. The device comprises a silicon on insulator (SOI) wafer including a layer of silicon 4 separated from a silicon substrate 5 by an insulator layer 6 formed of silicon dioxide. A portion of the layer of silicon 4 comprises a waveguide 1 that extends across a V-groove 2 formed in the silicon substrate 5. In that manner, the waveguide 1 is substantially thermally isolated from the silicon substrate 5.

As described in WO 99/21036, the waveguide 1 is a rib waveguide. An oxide coating 6A is formed over the rib waveguide 1 and an oxide layer 6 is formed under the rib waveguide 1. Temperature control means 9, such as metal coatings, are applied over the rib waveguide 1. By passing an electrical current therethrough, the temperature control means 9 are heated to heat the rib waveguide 1 and adjust the refractive index of the silicon of the rib waveguide 1. Because the rib waveguide 1 is substantially thermally isolated from the silicon substrate 5, the power and time required to heat the rib waveguide 1 are reduced.

SUMMARY OF THE INVENTION

The systems and methods of this invention provide thermal isolation of a silicon structure.

The systems and methods of this invention separately provide stress reduction for a silicon structure.

The systems and methods of this invention separately provide a substantially stress-free silicon structure.

The systems and methods of this invention separately provide a micromachined or microelectromechanical system based device with improved performance.

The systems and methods of this invention separately provide a micromachined or microelectromechanical system based device including a silicon structure that is at least partially thermally isolated from a substrate.

The systems and methods of this invention separately provide a micromachined or microelectromechanical system based device with improved manufacturability and reduced manufacturing costs.

The systems and methods of this invention separately provide thermal isolation of a silicon switch.

The systems and methods of this invention separately provide thermal isolation of a silicon waveguide.

According to various exemplary embodiments of the systems and methods of this invention, a micromachined device comprises a substrate, an insulation layer formed over at least part of the substrate, and a silicon layer formed over at least part of the insulation layer. The silicon layer includes a silicon structure that is at least partially thermally isolated from the substrate by a gap in the insulation layer and a surface of the substrate under the gap in the insulation layer is substantially unetched.

In various embodiments, the substrate is made of silicon. In various embodiments, the silicon layer is a single crystal silicon layer. In various embodiments, the insulation layer is made of silicon dioxide.

In various embodiments, the silicon structure is a thermo-optical switch. In various embodiments, the thermo-optical switch is a Mach-Zehnder switch.

According to various exemplary embodiments of the systems and methods of this invention, a micromachined device is fabricated by forming a substrate, forming an insulation layer over at least part of the substrate, forming a silicon layer over at least part of the insulation layer, forming a silicon structure in the silicon layer, and forming a gap in the insulation layer that at least partially thermally isolates the silicon structure from the substrate, wherein a surface of the substrate under the gap in the insulation layer is maintained substantially unetched.

According to other various exemplary embodiments of the systems and methods of this invention, a micromachined device is fabricated by forming a substrate, forming an insulation layer over at least part of the substrate, forming a silicon layer over at least part of the insulation layer, forming a silicon structure in the silicon layer, and forming a gap in the insulation layer without affecting a surface of the substrate underlying the gap.

In various embodiments, forming the gap in the insulation layer comprises removing a portion of the insulation layer with an etch that does not affect the substrate. In various embodiments, forming the substrate comprises forming a silicon substrate and removing the portion of the insulation layer is with an etch that does not affect silicon.

In various embodiments, forming the substrate comprises forming a substrate of a first material, forming the insulation layer comprises forming a layer of a second material, and forming the gap in the insulation layer comprises removing a portion of the insulation layer with an etch that is highly selective between the first and second materials.

In other various embodiments, forming the substrate comprises forming a substrate of silicon, forming the insulation layer comprises forming a layer of a dielectric material, and forming the gap in the insulation layer comprises removing a portion of the insulation layer with an etch that is highly selective between the dielectric material and silicon.

In other various embodiments, forming the substrate comprises forming a substrate of silicon, forming the insulation layer comprises forming a layer of silicon dioxide, and forming the gap in the insulation layer comprises removing a portion of the insulation layer with an etch that is highly selective between silicon dioxide and silicon.

These and other features and advantages of this invention are described in, or are apparent from, the following detailed description of various exemplary embodiments of the systems and methods according to this invention.

BRIEF DESCRIPTION OF THE DRAWINGS

Various exemplary embodiments of the systems and methods of this invention described in detail below, with reference to the attached drawing figures, in which.

DETAILED DESCRIPTION OF PREFERRED EMBODIMENTS

While this invention is described hereafter with respect to a silicon-based thermo-optical switch, it should be understood that the systems and methods of this invention are not so limited. On the contrary, the systems and methods of this invention contemplate any known or hereafter developed silicon structure that is to be at least partially thermally isolated from a substrate.

Furthermore, the systems and methods of this invention contemplate any known or hereafter developed device incorporating such a silicon structure. For example, a silicon-based thermo-optical switch as described below may be fabricated as part of a reconfigurable optical multiplexer as described in copending application Ser. No. 09/906,395, filed Nov. 8, 2001, which is incorporated herein by reference in its entirety.

According to various exemplary embodiments of this invention, micromachining and other microelectromechanical system based manufacturing techniques are used to fabricate a device with a silicon structure that is at least partially thermally isolated from a substrate. Such manufacturing technologies are relatively advanced compared to other potential technologies, yielding more reliable results and greater flexibility. However, it should be understood that this invention is not limited to such manufacturing techniques.

In various exemplary embodiments, surface micromachining techniques are used to fabricate a micro-device from a silicon on insulator (SOI) wafer as a starting material. However, surface micromachining techniques may be used to fabricate a micro-device according to this invention from a first wafer with an insulating layer, such as a patterned semiconductor layer, on at least one side and a second wafer, for example, of single crystal silicon, bonded to the insulating layer on the first wafer.

Figure 2:
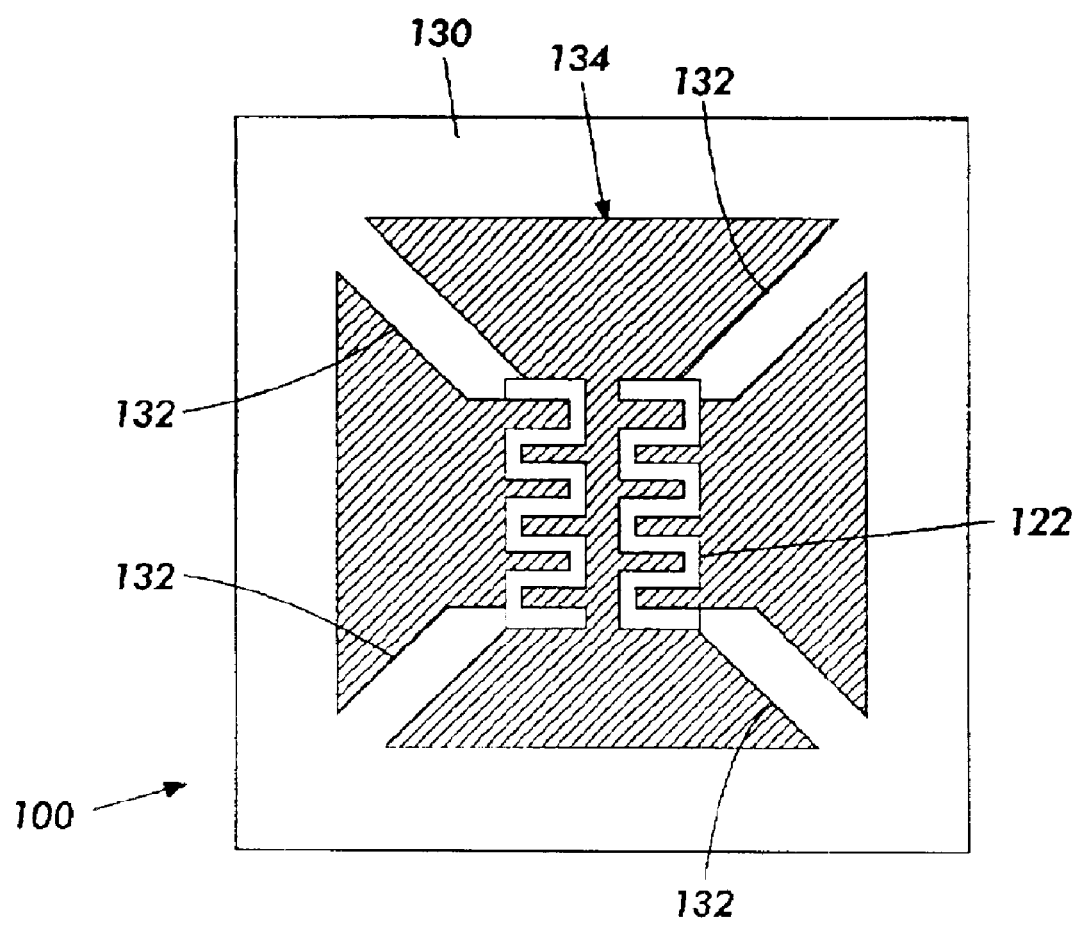
FIG. 2 is a top view of an exemplary embodiment of a micro-device including a thermo-optical switch according to this invention.

FIG. 2 shows a top view of an exemplary embodiment of a micro-device 100 including a silicon thermo-optical switch 122 according to this invention. In this exemplary embodiment, the silicon thermo-optical switch 122 is suspended by four arms 132. The arms 132 may be made of an dielectric material, such as silicon dioxide, and may form heat sinks for the silicon thermo-optical switch 122. Although not shown, the silicon thermo-optical switch 122 may be heated by any suitable means, either known or hereafter developed, such as those described in incorporated international patent document WO 99/21036.

As shown in FIG. 2, the arms 132 are defined by a gap 134 formed by a removal of a portion of an insulator layer 130. The insulator layer 130 is formed over a substrate (not shown) and separates the silicon thermo-optical switch 122 from the substrate. As shown, the gap 134 extends under the silicon thermo-optical switch 122. Thus, the silicon thermo-optical switch 122 is substantially thermally isolated from the substrate.

An exemplary embodiment of a method for fabricating a micro-device, such as the micro-device 100 shown in FIG. 2, according to this invention is illustrated in FIGS. 3–8B. More specifically, FIGS. 3–8B are top and cross-sectional views of various exemplary fabrication steps that may be used to fabricate a micro-device including a silicon thermo-optical switch that is at least partially thermally isolated from a substrate.

Figure 3:
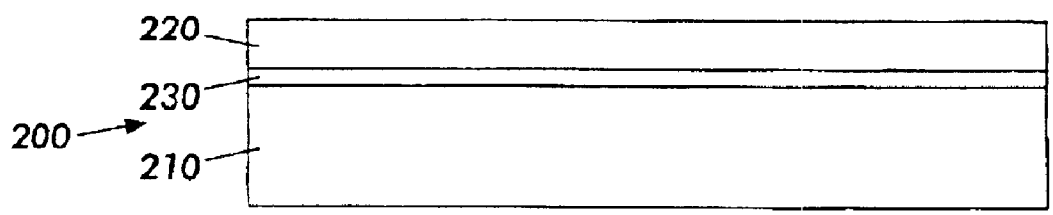
FIGS. 3–8B are top and cross-sectional views of various fabrication steps according to an exemplary embodiment of a method according to this invention.

As shown in FIG. 3, the micro-device may be fabricated on a single silicon chip. The single silicon chip may comprise a silicon on insulator (SOI) wafer 200 having a silicon substrate 210, a relatively thin single crystal silicon device layer 220 and an insulation layer 230 disposed between the device layer 220 and the substrate 210. The wafer 200 may be fabricated using any known or later developed silicon on insulator (SOI) techniques.

In the exemplary embodiment, the silicon thermo-optical switch is fabricated in the device layer 220. One or more polysilicon layers (not shown) may be added over the device layer 220 for fabrication of additional mechanical elements, such as hinges, guides, anchors and the like. Active electronic elements (not shown), such as electrical traces or logic circuitry, may also be defined in the device layer 220. Alternatively, the silicon thermo-optical switch may be fabricated in one of the polysilicon layers formed over the device layer 220.

Figure 4A:
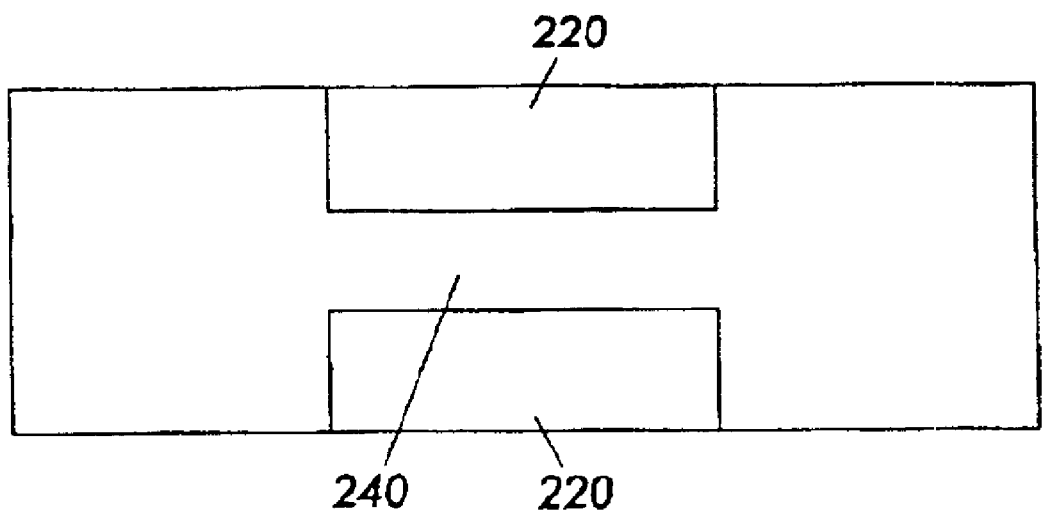
Figure 4B:
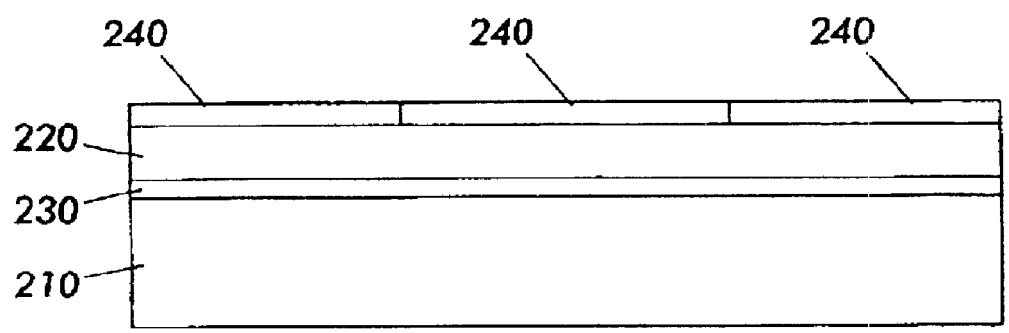

As shown in the top and cross-sectional views of FIGS. 4A and 4B, respectively, a first mask layer 240, such as a photoresist, is formed over the device layer 220. The first mask layer 240 may be deposited and patterned using suitable deposition and etching techniques, either known or hereafter developed, to define the silicon thermo-optical switch.

Figure 5A:
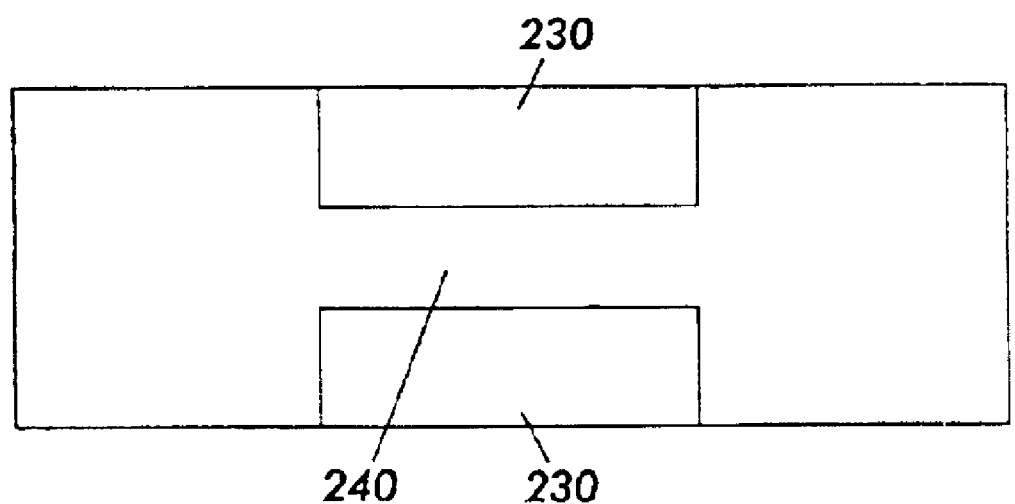
Figure 5B:
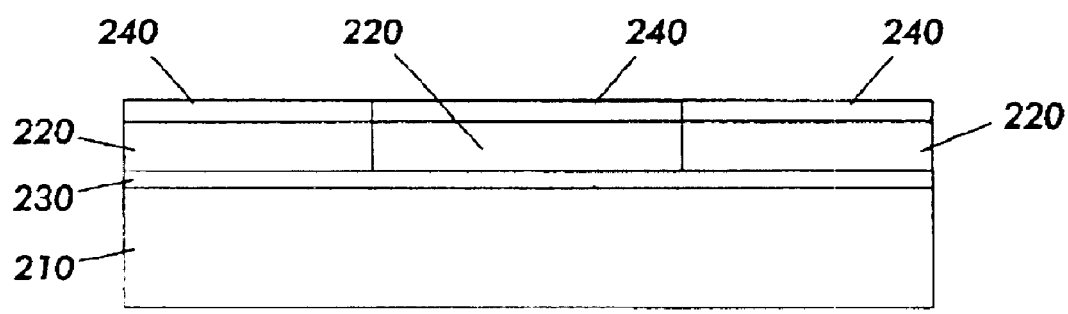
Figure 6A:
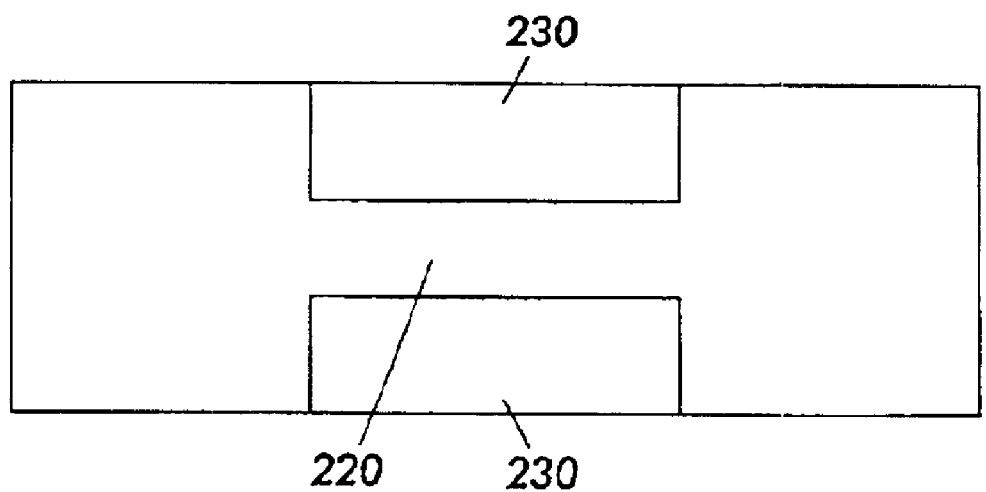
Figure 6B:
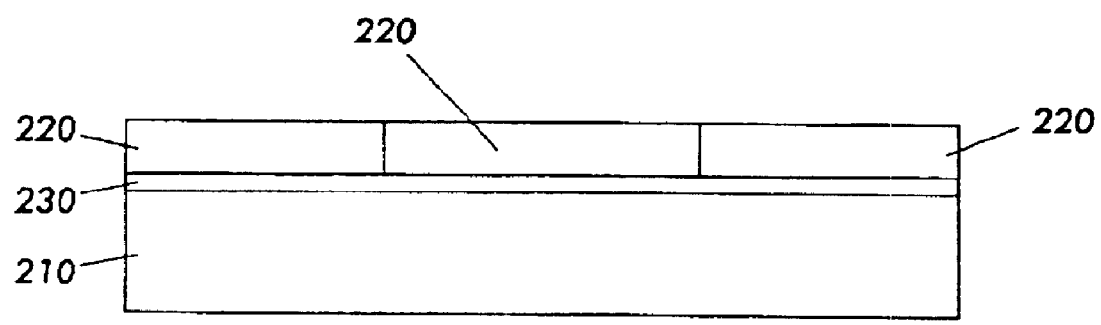

Using the first mask layer 240, exposed portions of the device layer 220 are etched, for example, using a reactive ion etch (RIE). As shown in FIGS. 5A and 5B, the etch is stopped at the insulator layer 230. Then, the first mask layer 240 is removed, as shown in FIGS. 6A and 6B, leaving the silicon thermo-optical switch in the device layer 220.

Figure 8A:
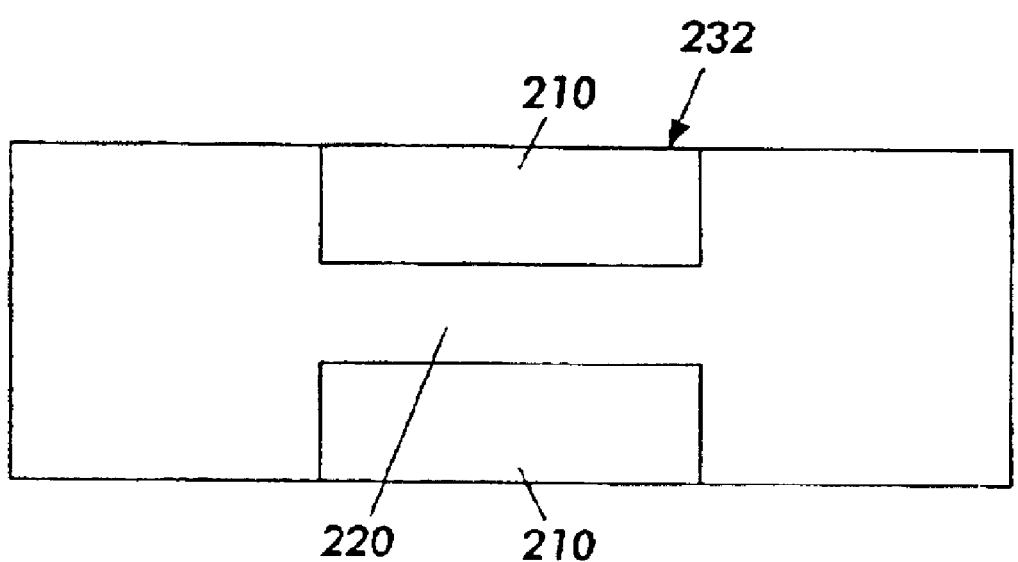
Figure 8B:
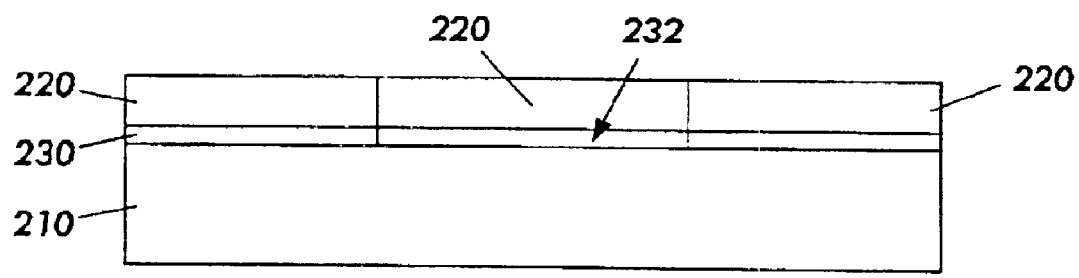

Once the silicon thermo-optical switch is defined in the device layer 220, a portion of the insulation layer 230 is removed to form a gap 232, shown in FIGS. 8A and 8B. The gap 232 formed in the insulation layer 230 at least partially thermally isolates the silicon thermo-optical switch in the device layer 220 from the substrate 210.

According to this invention, the substrate 210 is to remain intact and unaffected by the removal of the portion of the insulation layer 230 to form the gap 232. If a surface of the substrate 210 is damaged or partially removed with the removal of the portion of the insulation layer 230, important features of the micro-device that may be formed in the substrate 210 may be damaged or lost.

Figure 7A:
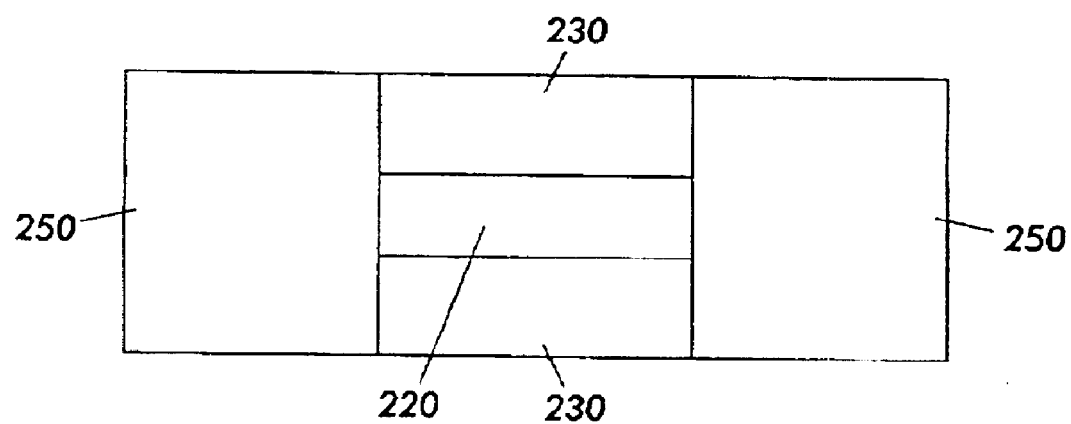
Figure 7B:
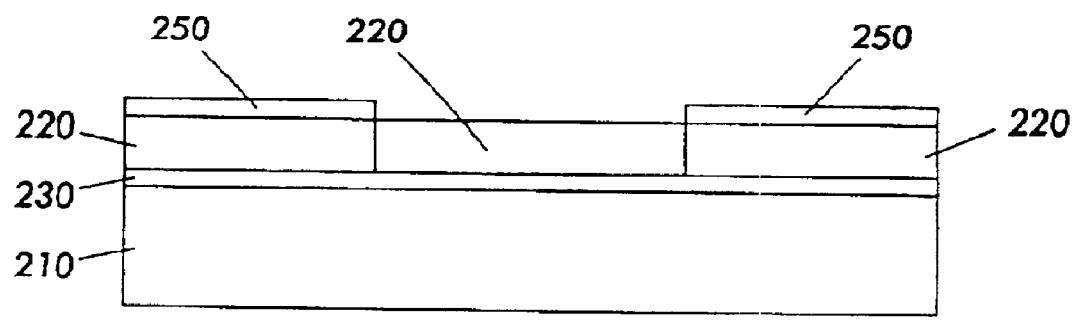

As shown in the top and cross-sectional views of FIGS. 7A and 7B, respectively, a second mask layer 250, such as a photoresist, is formed over at least part of the insulation layer 230. For the sake of efficiency in manufacturing, the second mask layer may also be formed over part or all of the device layer 220 remaining after the above-described etch. The second mask layer 250 may be deposited and patterned using suitable deposition and etching techniques, either known or hereafter developed, to define the extent of the gap 232 to be created.

Using the second mask layer 250, exposed portions of the insulation layer 230 are etched, for example, using a wet etch. According to this invention, the etchant is selected so that the exposed portions of the insulation layer 230 are removed without affecting a surface of the substrate 210 underlying the portions of the insulation layer 230 that are removed. In various embodiments, the selected etchant is highly selective between the materials of the insulation layer 230 and the substrate 210. For example, where the substrate 210 is made of silicon and the insulation layer 230 is made of silicon dioxide, the etchant may be a hydrofluoric acid solution that will attack the silicon dioxide without affecting the silicon during the time required to remove the portions of the insulation layer, typically less than one hour.

Selectivity will depend on the concentration of the hydrofluoric acid solution, as well as ambient temperature. For example, for a hydrofluoric acid solution at room temperature that is buffered, diluted with water, to have a hydrofluoric acid concentration of 49%, a selectivity of about 50:1 or greater is generally considered to be highly selective according to this invention. However, it is possible to use a selectivity of about 20:1 with an aggressive approach.

After the desired etch of the insulation layer 230 is completed, the second mask layer 250 is removed, as shown in FIGS. 8A and 8B, leaving a portion of the silicon thermo-optical switch in the device layer 220 that is substantially thermally isolated from the substrate 210 by the gap 232.

The systems and methods of this invention provide efficient fabrication of the micro-device by avoiding unnecessary steps. For example, selecting an etchant that does not attack the silicon of the substrate 210 avoids the need for a protective layer between the substrate 210 and the insulation layer 230 or the need for a highly controlled etch that removes only a predetermined thickness of the insulation layer 230 so that a partial thickness of the insulation layer remains over the substrate 210 where the gap 232 is formed. Further, since the thermo-optical switch in the device layer 220 is also made of silicon, the selected etchant will not attack the thermo-optical switch. Thus, a protective layer for the thermo-optical switch is not needed.

Furthermore, the portion of the silicon thermo-optical switch in the device layer 220 that is substantially thermally isolated from the substrate 210 by the gap 232 is substantially stress-free. During fabrication, stresses are generated at the silicon-insulation layer (oxide) interfaces. However, because the insulation layer 230 is removed at the gap 232, no interface remains that would otherwise induce deformation.

Figure 1:
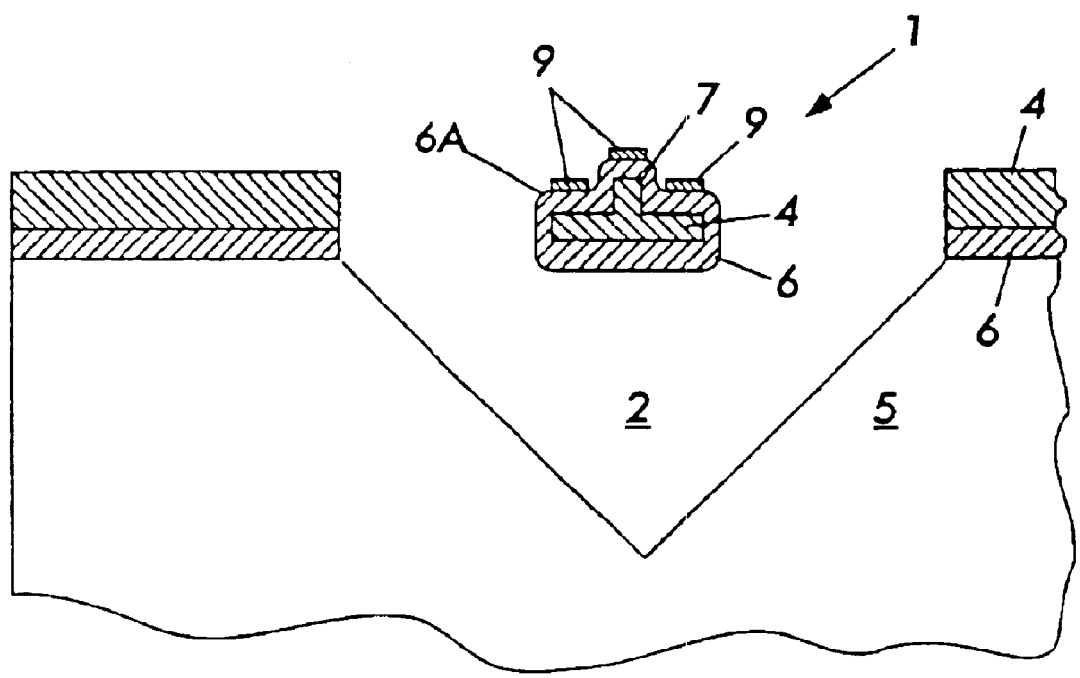
FIG. 1 is a cross-sectional view of a known device having a portion of a silicon layer thermally isolated from a silicon substrate.

On the contrary, as shown in FIG. 1, the oxide coating 6A formed over the rib waveguide 1 and the oxide layer 6 is formed under the rib waveguide 1 will result in undesirable stress in the rib waveguide 1. When the oxide layer 6 is separated from the silicon substrate 5, a silicon-oxide interface remains. The oxide layer 6 will tend to buckle the rib waveguide 1 toward or away from the silicon substrate 5 once the rib waveguide is separated from the silicon substrate 5.

A suitable technique for fabricating the silicon structure as an optical switch is described in copending U.S. patent applications Ser. No. 09/467,526 and U.S. Pat. Nos. 6,362, 512 and 6,379,989 which are incorporated herein by reference in their entirety. Another suitable technique is described in copending U.S. patent application Ser. No. 09/718,107, which is incorporated herein by reference in its entirety.

While this invention has been described in conjunction with various exemplary embodiments, it is to be understood that many alternatives, modifications and variations would be apparent to those skilled in the art. Accordingly, Applicants intend to embrace all such alternatives, modifications and variations that follow in the spirit and scope of this invention.

For example, while techniques described above for fabricating a micromachined device according to this invention are particularly suitable, it should be understood that any known or later developed processing technique for microdevices may be used. For example, conventional photolithography and etching techniques may be used.

What is claimed is:

1. A method for fabricating a thermo-optical switch, comprising:
    forming a substrate;
    forming an insulation layer over at least part of the substrate;
    forming a silicon layer over at least part of the insulation layer;
    forming a silicon structure in the silicon layer; and
    forming a gap in the insulation layer that at least partially thermally isolates the silicon structure from the substrate,
    wherein a surface of the substrate under the gap in the insulation layer is maintained substantially unetched and the gap in the resulting thermo-optical switch remains at least partially open.

2. The method of claim 1, wherein forming the gap in the insulation layer comprises removing a portion of the insulation layer with an etch that does not affect the substrate.

3. The method of claim 2, wherein forming the substrate comprises forming a silicon substrate and removing the portion of the insulation layer is with an etch that does not affect silicon.

4. The method of claim 1, wherein forming the substrate comprises forming a substrate of a first material, forming the insulation layer comprises forming a layer of a second material, and forming the gap in the insulation layer comprises removing a portion of the insulation layer with an etch that is highly selective between the first and second materials.

5. The method of claim 4, wherein removing a portion of the insulation layer with an etch that is highly selective between the first and second materials comprises removing a portion of the insulation layer with an etch having a selectivity of about 20:1 or greater.

6. The method of claim 1, wherein forming the substrate comprises forming a substrate of silicon, forming the insulation layer comprises forming a layer of a dielectric material, and forming the gap in the insulation layer comprises removing a portion of the insulation layer with an etch that is highly selective between the dielectric material and silicon.

7. The method of claim 1, wherein forming the substrate comprises forming a substrate of silicon, forming the insulation layer comprises forming a layer of silicon dioxide, and forming the gap in the insulation layer comprises removing a portion of the insulation layer with an etch that is highly selective between silicon dioxide and silicon.

8. A method for fabricating a thermo-optical switch, comprising:
    forming a substrate;
    forming an insulation layer over at least part of the substrate;
    forming a silicon layer over at least part of the insulation layer;
    forming a silicon structure in the silicon layer; and
    forming a gap in the insulation layer without affecting a surface of the substrate underlying the gap, wherein the gap of the resulting thermo-optical switch remains at least partially open.

9. The method of claim 8, wherein forming the gap in the insulation layer comprises removing a portion of the insulation layer with an etch that does not affect the surface of the substrate underlying the gap.

10. The method of claim 9, wherein forming the substrate comprises forming a silicon substrate and removing the portion of the insulation layer is with an etch that does not affect silicon.

11. The method of claim 8, wherein forming the substrate comprises forming a substrate of a first material, forming the insulation layer comprises forming a layer of a second material, and forming the gap in the insulation layer comprises removing a portion of the insulation layer with an etch that is highly selective between the first and second materials.

12. The method of claim 11, wherein removing a portion of the insulation layer with an etch that is highly selective between the first and second materials comprises removing a portion of the insulation layer with an etch having a selectivity of about 20:1 or greater.

13. The method of claim 8, wherein forming the substrate comprises forming a substrate of silicon, forming the insulation layer comprises forming a layer of a dielectric material, and forming the gap in the insulation layer comprises removing a portion of the insulation layer with an etch that is highly selective between the dielectric material and silicon.

14. The method of claim 8, wherein forming the substrate comprises forming a substrate of silicon, forming the insulation layer comprises forming a layer of silicon dioxide, and forming the gap in the insulation layer comprises removing a portion of the insulation layer with an etch that is highly selective between silicon dioxide and silicon.

15. A thermo-optical switch, comprising:

a substrate;

an insulation layer formed over at least part of the substrate; and a silicon layer formed over at least part of the insulation layer, the silicon layer including a silicon structure that is at least partially thermally isolated from the substrate by a gap in the insulation layer, wherein a surface of the substrate under the gap in the insulation layer is substantially unetched and the gap of the resulting thermo-optical switch remains at least partially open.

16. The thermo-optical switch of claim 15, wherein the substrate is made of silicon.

17. The thermo-optical switch of claim 16, wherein the silicon layer is a single crystal silicon layer.

18. The thermo-optical switch of claim 17, wherein the insulation layer is made of silicon dioxide.

19. The thermo-optical switch of claim 15, wherein the thermo-optical switch is a Mach-Zehnder switch.

* * * * *